(12) United States Patent
Nodake et al.

(10) Patent No.: US 9,105,846 B2
(45) Date of Patent: Aug. 11, 2015

(54) METHOD OF MANUFACTURING A BOUNDARY ACOUSTIC WAVE DEVICE

(71) Applicant: Murata Manufacturing Co., Ltd., Nagaokakyo-shi, Kyoto-fu (JP)

(72) Inventors: Naohiro Nodake, Nagaokakyo (JP); Hideaki Takahashi, Nagaokakyo (JP); Shin Saijo, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 331 days.

(21) Appl. No.: 13/873,301

(22) Filed: Apr. 30, 2013

(65) Prior Publication Data

US 2013/0232747 A1 Sep. 12, 2013

Related U.S. Application Data

(60) Division of application No. 13/276,341, filed on Oct. 19, 2011, now Pat. No. 8,471,435, which is a continuation of application No. PCT/JP2010/056983, filed on Apr. 20, 2010.

(30) Foreign Application Priority Data

Apr. 22, 2009 (JP) ................. 2009-103774

(51) Int. Cl.
| | |
|---|---|
| *H01L 41/22* | (2013.01) |
| *H03H 3/10* | (2006.01) |
| *H01L 41/29* | (2013.01) |
| *H03H 3/04* | (2006.01) |
| *H01L 41/27* | (2013.01) |
| *H03H 9/02* | (2006.01) |

(52) U.S. Cl.
CPC ............. *H01L 41/29* (2013.01); *H01L 41/22* (2013.01); *H01L 41/27* (2013.01); *H03H 3/04* (2013.01); *H03H 3/10* (2013.01); *H03H 9/0222* (2013.01); *H03H 2003/045* (2013.01); *H03H 2003/0414* (2013.01); *Y10T 29/42* (2015.01); *Y10T 29/49005* (2015.01); *Y10T 29/49155* (2015.01)

(58) Field of Classification Search
CPC ......... H01L 41/22; H01L 41/27; H01L 41/29; H03H 3/04; H03H 3/10; H03H 2003/0414; H03H 2003/045; H03H 9/0222; Y10T 29/42; Y10T 29/49005; Y10T 29/49155
See application file for complete search history.

(56) References Cited

U.S. PATENT DOCUMENTS 8,471,435 B2 * 6/2013 Nodake et al. .......... H01L 41/29
2007/0241840 A1 * 10/2007 Takayama et al. ....... H03H 3/10

FOREIGN PATENT DOCUMENTS

JP 06326553 A * 11/1994

* cited by examiner

*Primary Examiner* — A. Dexter Tugbang
(74) *Attorney, Agent, or Firm* — Keating & Bennett, LLP (57) ABSTRACT

A manufacturing method for a boundary acoustic wave device is provided which includes, an IDT electrode, a first dielectric layer, and a second dielectric layer on a piezoelectric substrate. The first dielectric layer is made of a deposited film. A thickness of the IDT electrode is about 10% or more of λ. A difference between a height of the first dielectric layer, measured from an upper surface of the piezoelectric substrate, above a center of an electrode finger of the IDT electrode and a height of the first dielectric layer, measured from the upper surface of the piezoelectric substrate, above a center of a gap between adjacent electrode fingers, i.e., a magnitude of unevenness in an upper surface of the first dielectric layer, is about 5% or less of λ.

4 Claims, 5 Drawing Sheets

METHOD OF MANUFACTURING A BOUNDARY ACOUSTIC WAVE DEVICE

BACKGROUND OF THE INVENTION

1. Field of the Invention

The present invention relates to a boundary acoustic wave device preferably for use in a resonator, a band filter, etc., and to a method of manufacturing such a boundary acoustic wave device. More particularly, the present invention relates to a boundary acoustic wave device including a so-called three-medium structure in which first and second dielectric layers are stacked on a piezoelectric substrate, and to a manufacturing method thereof.

2. Description of the Related Art

Conventionally, in communication systems such as cellular phones, surface acoustic wave devices have been widely used as resonators and band filters. Also, attention has been focused on boundary acoustic wave devices instead of surface acoustic wave devices because the former does not require a package structure having a cavity. For that reason, boundary acoustic wave devices of various structures have been proposed.

Figure 9:
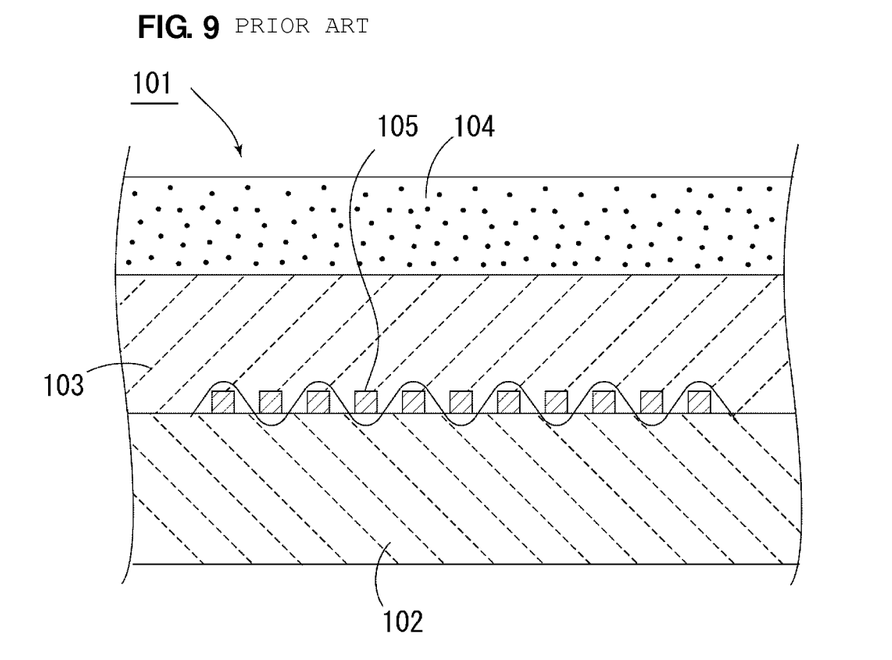
FIG. 9 is a front sectional view to explain a boundary acoustic wave device of the related art.

WO2005/093949 discloses a boundary acoustic wave device 101 illustrated in a sectional view of FIG. 9. The boundary acoustic wave device 101 is a boundary acoustic wave device of a three-medium structure. In the boundary acoustic wave device 101, first and second dielectric layers 103 and 104 are stacked on a piezoelectric substrate 102. An electrode structure including IDT electrodes 105 is formed at an interface between the piezoelectric substrate 102 and the first dielectric layer 103.

When manufacturing the boundary acoustic wave device 101, firstly, the piezoelectric substrate 102 is prepared. The electrode structure including the IDT electrodes 105 is then formed on the piezoelectric substrate 102. The first dielectric layer 103 is then formed by magnetron sputtering. In this stage, the frequency, the acoustic velocity of a boundary acoustic wave, etc., are adjusted by adjusting a film thickness of the first dielectric layer 103. After the adjustment, the second dielectric layer 104 is formed.

The first dielectric layer 103 can also be formed by a method of bonding a dielectric wafer, which is prepared separately, instead of magnetron sputtering. However, it is difficult to uniformly bond the dielectric wafer. Further, there is a risk that the first dielectric layer 103 may be peeled off when a laminate body obtained as a mother substrate is cut. On the other hand, the first dielectric layer 103 can be easily and reliably formed by the manufacturing method described in WO2005/093949 because it utilizes the magnetron sputtering.

With the manufacturing method described in WO2005/093949, however, even when the frequency and the acoustic velocity of a boundary acoustic wave are adjusted before formation of the second dielectric layer 104, frequency characteristics, such as a resonant frequency and a center frequency, tend to vary in the manufactured boundary acoustic wave device 101 because the second dielectric layer 104 is formed after the adjustment.

SUMMARY OF THE INVENTION

In order to overcome the above-mentioned problems in the related art, preferred embodiments of the present invention provide a boundary acoustic wave device and a method of manufacturing a boundary acoustic wave device, in which a first dielectric layer can be easily and reliably formed, and in which a variation in frequency characteristics of the finally obtained boundary acoustic wave device is significantly reduced and minimized.

A boundary acoustic wave device according to a preferred embodiment of the present invention includes a piezoelectric substrate, an IDT electrode provided on the piezoelectric substrate, a first dielectric layer arranged to cover the IDT electrode and made of a deposited film, and a second dielectric layer disposed on the first dielectric layer. Further, assuming a wavelength of a boundary acoustic wave to be $\lambda$, a normalized film thickness of the IDT electrode is about 10% or more of $\lambda$, and a difference between a height of the first dielectric layer, measured from an upper surface of the piezoelectric substrate, above a center of an electrode finger of the IDT electrode and a height of the first dielectric layer, measured from the upper surface of the piezoelectric substrate, above a center of a gap between adjacent electrode fingers is about 5% or less of the wavelength $\lambda$.

In one particular aspect of the boundary acoustic wave device according to a preferred embodiment of the present invention, the first dielectric layer preferably is the deposited film formed by bias sputtering, for example. In that case, flatness of an upper surface of the first dielectric layer can be increased.

In another particular aspect of the boundary acoustic wave device according to a preferred embodiment of the present invention, the upper surface of the first dielectric layer is flattened. In that case, a surface of the second dielectric layer formed on the first dielectric layer can be made flatter.

In still another particular aspect of the boundary acoustic wave device according to a preferred embodiment of the present invention, the piezoelectric substrate preferably is made of $LiNbO_3$ or $LiTaO_3$, and the first dielectric layer preferably is made of silicon oxide. In that case, an absolute value of the temperature coefficient of frequency (TCF) in the boundary acoustic wave device can be reduced.

In still another particular aspect of the boundary acoustic wave device according to a preferred embodiment of the present invention, the second dielectric layer preferably is made of at least one kind of dielectric material selected from a group consisting of silicon nitride, silicon oxynitride, aluminum nitride, aluminum oxide, and silicon. In that case, since the acoustic velocity in the second dielectric layer is higher than that in silicon oxide, a loss can be reduced due to the waveguide effect.

In still another particular aspect of the boundary acoustic wave device according to a preferred embodiment of the present invention, the IDT electrode is primarily formed of an electrode layer made of at least one kind of metal selected from a group consisting of Au, Ag, Cu, Pt, Ta, W, Ni, Fe, Cr, Mo, Ti, and an alloy containing one of those metals as a main component. In that case, by using, as the material of the IDT electrode, a metal having a relatively higher density than that of the first dielectric layer, the waveguide effect can be enhanced and the loss can be further reduced.

According to another preferred embodiment of the present invention, a method of manufacturing a boundary acoustic wave device includes the steps of forming an IDT electrode on a piezoelectric substrate, depositing a dielectric material on the piezoelectric substrate to cover the IDT electrode by a deposition method, thereby forming a first dielectric layer, and forming a second dielectric layer on the first dielectric layer.

In one particular aspect of the method of manufacturing the boundary acoustic wave device according to a preferred embodiment of the present invention, the deposition method is bias sputtering. In that case, flatness of the upper surface of the first dielectric layer can be increased.

In another particular aspect of the method of manufacturing the boundary acoustic wave device according to a preferred embodiment of the present invention, the method further includes the step of flattening a surface of the first dielectric layer after forming the first dielectric layer by the deposition method. In that case, since the surface of the first dielectric layer can be made flatter, unevenness in the surface of the second dielectric layer can be made smaller.

In still another particular aspect of the method of manufacturing the boundary acoustic wave device according to a preferred embodiment of the present invention, the step of flattening the upper surface of the first dielectric layer is carried out by at least one process selected from a group consisting of milling, dry etching, CMP, and etching-back of the surface of the first dielectric layer. In that case, the upper surface of the first dielectric layer can be more reliably and easily flattened.

With the boundary acoustic wave device and the method of manufacturing the same according to various preferred embodiments of the present invention, the film thickness of the IDT electrode preferably is as large as about 10% or more of the wavelength λ of the boundary acoustic wave, while the difference between the height of the first dielectric layer above the center of an electrode finger of the IDT electrode and the height of the first dielectric layer above the center of a gap between the adjacent electrode fingers is preferably about 5% or less of λ. Therefore, variations in frequency characteristics of the boundary acoustic wave device are significantly reduced and minimized. As a result, a boundary acoustic wave resonator, a boundary acoustic wave filter, and other similar devices, etc., can be produced to have a small variation in frequency characteristics, such as a center frequency and a resonant frequency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by the following description of preferred embodiments of the present invention with reference to the drawings.

Figure 1A:
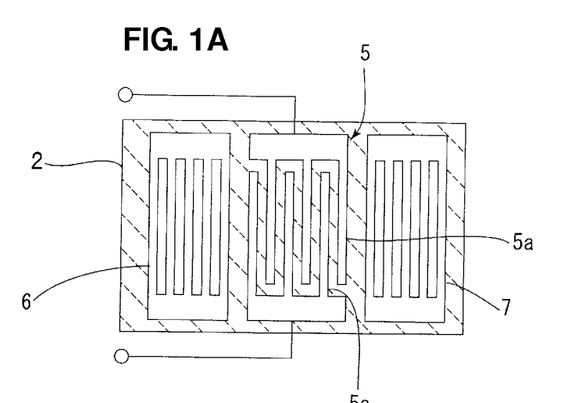
FIG. 1A is a schematic plan view illustrating an electrode structure of a boundary acoustic wave device according to one preferred embodiment of the present invention.
Figure 1B:
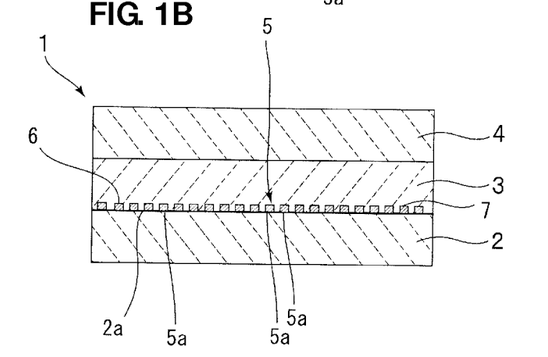
FIG. 1B is a front sectional view of the boundary acoustic wave device.
Figure 1C:
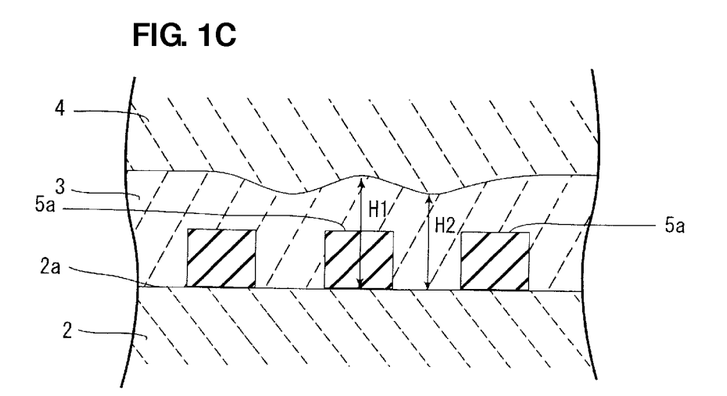
FIG. 1C is a partially-cut front sectional view illustrating, in an enlarged scale, a principal portion of the boundary acoustic wave device.

FIG. 1A is a schematic plan view illustrating an electrode structure of a boundary acoustic wave device according to one preferred embodiment of the present invention, FIG. 1B is a front sectional view of the boundary acoustic wave device, and FIG. 1C is a partially-cut front sectional view illustrating, in an enlarged scale, a principal portion of the boundary acoustic wave device.

A boundary acoustic wave device 1 includes a piezoelectric substrate 2. First and second dielectric layers 3 and 4 are stacked on the piezoelectric substrate 2 in this order. Thus, the boundary acoustic wave device 1 is a boundary acoustic wave device including a so-called three-medium structure.

In this preferred embodiment, a 25°-rotated Y cut $LiNbO_3$ single-crystal substrate is preferably used as the piezoelectric substrate 2, for example. The first dielectric layer 3 is made of $SiO_2$, for example. The second dielectric layer 4 is made of SiN, for example.

As described later, the first dielectric layer 3 is preferably formed by bias sputtering, for example. The second dielectric layer 4 made of SiN is preferably formed by RF magnetron sputtering, for example. In other words, the first and second dielectric layers 3 and 4 are preferably formed by deposition methods.

An electrode structure including an IDT electrode 5 and reflectors 6 and 7 disposed on both sides of the IDT electrode 5 is provided on an upper surface of the piezoelectric substrate 2. The IDT electrode 5 includes a plurality of electrode fingers 5a. The IDT electrode 5 and the reflectors 6 and 7 are each formed by stacking a plurality of metal films. In this preferred embodiment, a Ti film/Pt film/Ti film/AlCu film/Ti film/Pt film/Ti film are successively stacked in this order from the top.

The Ti film between the AlCu film and the Pt film serves as not only a barrier layer to prevent inter-diffusion of metal atoms between the metal films on both sides thereof, but also as an adhesive layer to increase adhesion to the metal films on both sides thereof. The Ti film between each of the first dielectric layer and the piezoelectric substrate and the Pt film serves as an adhesive layer.

Accordingly, the film thickness of the Ti film serving as the adhesive layer and/or the barrier layer is preferably set smaller than that of each of the Pt film and the AlCu film. Thus, the IDT electrode 5 includes the Pt film and the AlCu film as main electrode layers.

In FIG. 1B, an upper surface of the first dielectric layer 3 is illustrated as being flat. However, when the first dielectric layer 3 is formed by the deposition method such as the bias sputtering, the upper surface of the first dielectric layer 3 usually includes unevenness.

The boundary acoustic wave device 1 of this preferred embodiment preferably is a 1-port boundary acoustic wave resonator including the IDT electrode 5 and the reflectors 6 and 7.

In the boundary acoustic wave device 1, because the acoustic velocity in the second dielectric layer 4 is higher than that in the first dielectric layer 3, a boundary acoustic wave is substantially confined within the first dielectric layer due to the waveguide effect. As a result, a loss can be reduced.

When the first dielectric layer 3 is formed by the deposition method including the sputtering, a material forming the first dielectric layer 3 is uniformly deposited on the piezoelectric substrate 2. Therefore, the film thickness of the first dielectric layer 3 is substantially uniform over an entire region. Hence, a height of the upper surface of the first dielectric layer 3 is increased in portions where the IDT electrode 5 and reflectors 6 and 7 are present, thus causing unevenness in the upper surface of the first dielectric layer 3.

In this preferred embodiment, however, as illustrated in FIG. 1C, a difference between a height H1 of the first dielectric layer 3 above a center of the electrode finger of the IDT electrode 5 and a height H2 of the first dielectric layer 3 above a center of the gap between the electrode fingers is preferably set to be about 5% or less of $\lambda$, for example. Stated another way, even when the thickness of the IDT electrode 5 is set as large as about 10% or more of $\lambda$, the unevenness in the upper surface of the first dielectric layer 3 is held relatively small. Here, the height H1 and the height H2 are each defined as a value measured from an upper surface 2a of the piezoelectric substrate 2 in the height direction. Further, $\lambda$ denotes a wavelength of the boundary acoustic wave.

Since the difference between the height H1 and the height H2 is preferably about 5% or less of $\lambda$ in the boundary acoustic wave device 1, a variation in frequency characteristics, i.e., a frequency tolerance, can be kept small in the boundary acoustic wave device 1. That point will be described in more detail below.

Conventionally, in a boundary acoustic wave device, reducing the conductor resistance of an IDT electrode has been tried to reduce a loss. For example, it has been tried to increase the film thickness of the IDT electrode, or to use an electrode formed by stacking an Al film, which has a low conductor resistance, on a Pt film. However, when such a multilayer metal film is used, a total film thickness of the IDT electrode is increased. Consequently, when a dielectric layer is formed so as to cover the IDT electrode by the deposition method, a level difference tends to occur in an upper surface of the dielectric layer between a portion where the IDT electrode 5 is present below and a portion where the IDT electrode is not present below.

The inventors of this application have discovered that the above-described problem of increasing the frequency tolerance in the boundary acoustic wave device of the three-medium structure is attributable to the magnitude of unevenness in the surface of the first dielectric layer 3. In preferred embodiments of the present invention, since the unevenness in the upper surface of the first dielectric layer 3, i.e., the level difference between an uppermost portion and a lowermost portion of the first dielectric layer, is preferably set to be about 5% or less of $\lambda$ as described above, the frequency tolerance can be held very small. Particularly, even when, for the purpose of reducing the resistance of the IDT electrode 5, the thickness of the IDT electrode is set as large as about 10% or more of the wavelength $\lambda$ by increasing the thickness of the IDT electrode 5 or by forming the IDT electrode 5 with the use of the multilayer metal film, the frequency tolerance can be held very small.

That point will be described below based on a specific experimental example.

A non-limiting example of the boundary acoustic wave device 1 of the above-described preferred embodiment was fabricated as follows. The piezoelectric substrate 2 made of 25°-rotated Y cut LiNbO$_3$ was prepared. The IDT electrode 5 and the reflectors 6 and 7 were formed on the upper surface of the piezoelectric substrate by an electron beam evaporation method.

In this experimental example, prior to forming the IDT electrode 5 and the reflectors 6 and 7, a Ta$_2$O$_5$ film was formed as an underlying film on the upper surface of the piezoelectric substrate. The underlying film is not always required. The formation of the underlying film contributes to increasing adhesion of the IDT electrode 5, etc., to the piezoelectric substrate 2.

The IDT electrode 5 and the reflectors 6 and 7 were each formed as the above-mentioned multilayer metal film. Respective thicknesses of the metal films were as follows.

In the IDT electrode 5, the wavelength $\lambda$ was set to about 1.9 μm, a duty ratio was set to about 0.50, the number of pairs of the electrode fingers was set to 60, and an opening length, i.e., a distance between opposing bus bars, was set to about 30 $\lambda$, for example. The number of the electrode fingers in each of the reflectors 6 and 7 was set to 51.

Ti film: about 10 nm, i.e., about 0.5% of the wavelength $\lambda$.

Thickness of each Pt film: about 31 nm, i.e., about 1.6% of the wavelength $\lambda$.

AlCu film: made of an alloy containing Al as a main component with a Cu concentration of about 1% by weight, and having a film thickness of about 300 nm, i.e., about 16% in terms of ratio to the wavelength.

Accordingly, the total thickness of the IDT electrode 5 was given by about 0.5%×4+about 1.6%×2+about 16%=about 21.2% of the wavelength $\lambda$.

Thickness of Ta$_2$O$_5$ film: about 12 nm, i.e., about 0.6% of the wavelength $\lambda$.

Next, as the first dielectric layer 3, a SiO$_2$ film was formed by the bias sputtering. The thickness of the SiO$_2$ film was set to about 712 nm, i.e., about 38% of $\lambda$.

Next, as the second dielectric layer 4, a SiN film was formed with a thickness of about 2000 nm, i.e., about 105% in terms of ratio to the wavelength, by the RF magnetron sputtering.

Problems caused when fabricating a boundary acoustic wave device of the three-medium structure likewise in accordance with the related-art manufacturing method will be described below.

Figure 2:
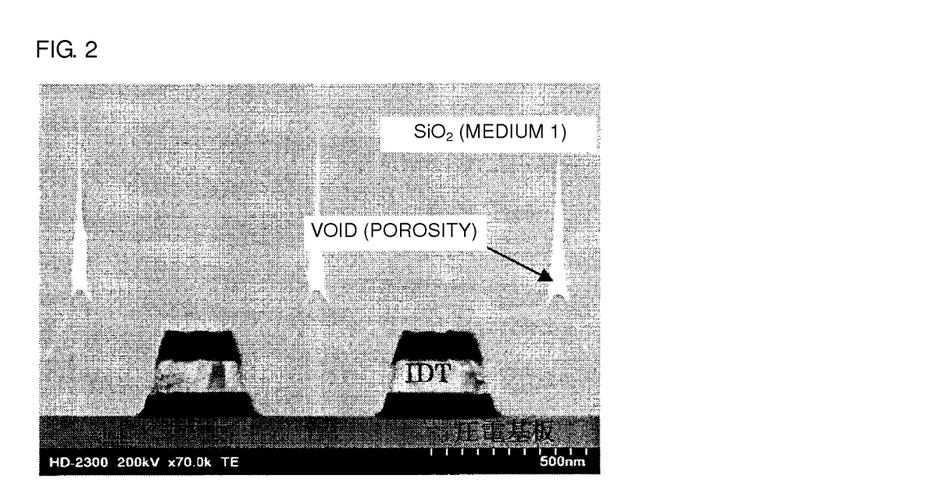
FIG. 2 is an electron microscope photo to explain voids generated when a $SiO_2$ film is formed by RF magnetron sputtering.

In trying to reduce the conductor resistance by increasing the thickness of the IDT electrode, as described above, when SiO$_2$ serving as the first dielectric layer, etc. are formed by the deposition method such as the RF magnetron sputtering, the unevenness of the surface of the SiO$_2$ film is increased. Moreover, as seen from an electron microscope photo of FIG. 2, a void may be generated in the SiO$_2$ above a center of a gap between the electrode fingers of the IDT electrode. Such a phenomenon is presumably attributable to the fact that the SiO$_2$ films are gradually deposited to cover adjacent finger electrodes and are contacted with each other while forming a void above the center of the gap, thus forming an integral film. As a result, an impedance ratio in a boundary acoustic wave resonator, i.e., a ratio of impedance at the anti-resonant frequency to impedance at the resonant frequency, is reduced and degraded. That point is illustrated in FIG. 3.

Figure 3:
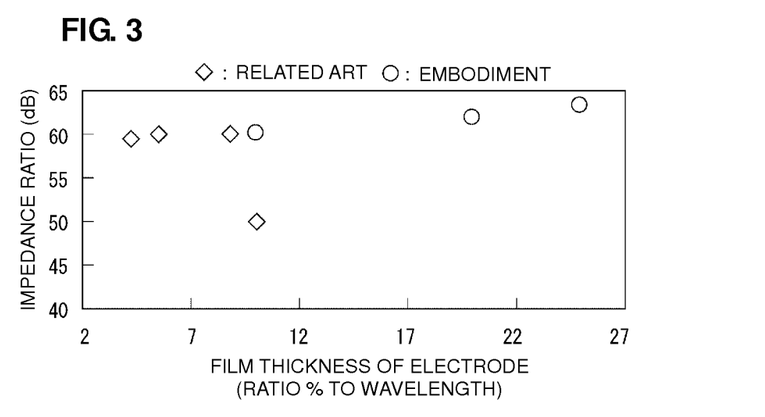
FIG. 3 is a graph plotting the relationship between a film thickness of an IDT electrode and an impedance ratio of a resonator when the $SiO_2$ film is formed by bias sputtering and ordinary RF magnetron sputtering.

Marks ◇ in FIG. 3 represent changes in the impedance ratio when SiO$_2$ is formed as the first dielectric layer 3 by the RF magnetron sputtering and a film thickness of the SiO$_2$ is gradually increased. As is apparent from FIG. 3, when the film thickness of the IDT electrode exceeds about 10% in terms of ratio to the wavelength, the impedance ratio is quickly dropped from about 60 dB to about 50 dB, for example.

On the other hand, marks ○ in FIG. 3 represent the result obtained when the film thickness of the IDT electrode is changed in this preferred embodiment in which the first dielectric layer 3 is formed by the bias sputtering. As is apparent from FIG. 3, even when the film thickness of the IDT electrode is increased to about 25% in excess of about 10%, the impedance ratio is not reduced. It is hence understood that, even when the total film thickness of the IDT electrode is increased by additionally stacking a metal film having a low conductor resistance, e.g., an Al film, the impedance ratio is hard to degrade.

Meanwhile, in the boundary acoustic wave device of the three-medium structure, the frequency varies depending on the film thickness of the first dielectric layer 3. Therefore, the frequency can be adjusted by adjusting the film thickness of the first dielectric layer 3. That frequency adjustment can be performed by a film-thickness adjusting method, such as milling. In this preferred embodiment, since the first dielectric layer 3 is formed by the bias sputtering prior to the film-thickness adjustment with the milling, for example, the unevenness in the upper surface of the first dielectric layer 3 is made smaller.

Figure 4A:
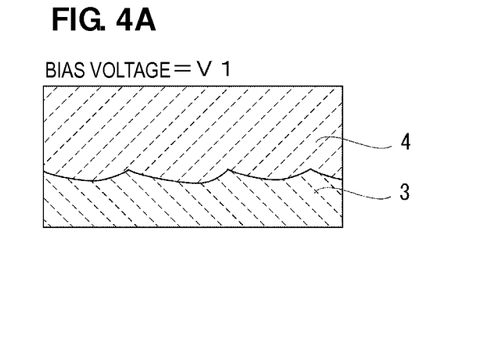
FIGS. 4A to 4C are each a schematic sectional view illustrating the state of an interface between the $SiO_2$ film and a SiN film, the $SiO_2$ film being formed by the bias sputtering at a bias voltage of V1, V2 or V3, respectively.
Figure 4B:
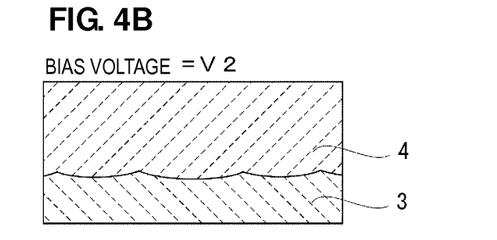
Figure 4C:
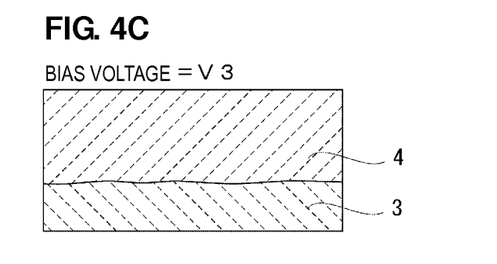

The term "bias sputtering" implies a process of applying a bias voltage to a substrate during sputtering, and forming a film on the substrate by the sputtering in the state where the bias voltage is applied to the substrate. The inventors of this application have discovered that the unevenness in the upper surface of the first dielectric layer 3 can be reduced by changing the bias voltage. FIGS. 4A to 4C are each a schematic sectional view illustrating the state of an interface between the first and second dielectric layers 3 and 4. FIGS. 4A, 4B and 4C indicate the results obtained at the bias voltage of V1, V2 and V3, respectively. Herein, there is a relationship of V1<V2<V3 among the bias voltages.

As seen from FIGS. 4A to 4C, as the bias voltage increases, the unevenness in the upper surface of the first dielectric layer 3 is reduced.

Figure 5:
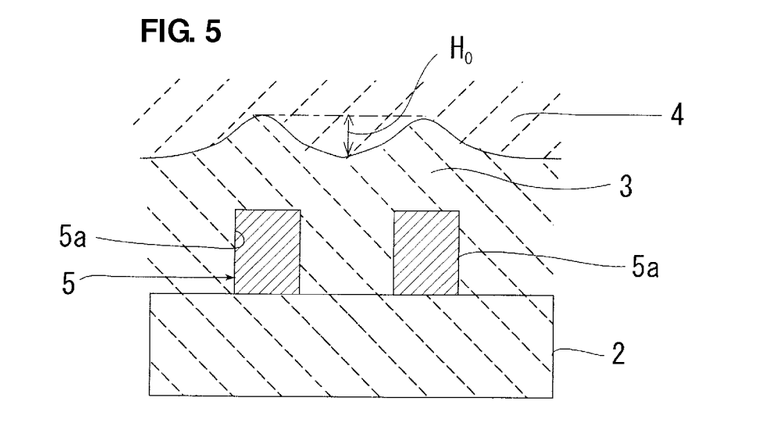
FIG. 5 is a schematic front sectional view to explain the magnitude of unevenness in an upper surface of the $SiO_2$ film formed on the IDT electrode.

The unevenness illustrated in FIGS. 4A to 4C is attributable to the fact that, as schematically illustrated in FIG. 5, the height of the first dielectric layer 3 made of $SiO_2$ differs between a portion where a finger electrode 5a of the IDT electrode 5 is present below and a portion where a gap between the electrode fingers 5a and 5a is present below.

Figure 6:
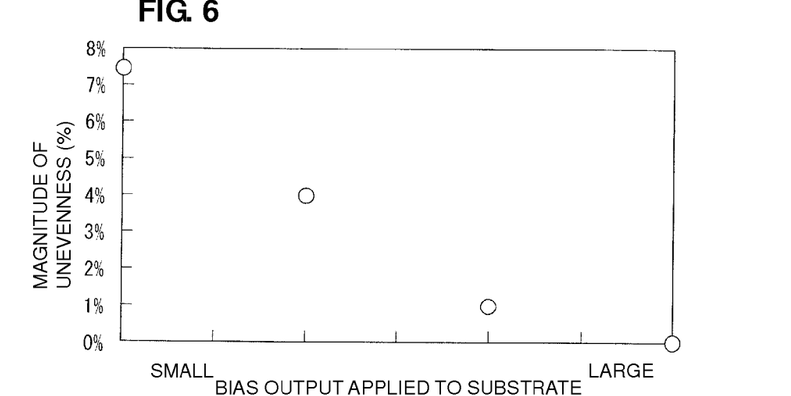
FIG. 6 is a graph plotting the relationship between the magnitude of the bias voltage and the magnitude of unevenness in the upper surface of the $SiO_2$ film when the bias sputtering is carried out.

Taking the above point into consideration, changes in the unevenness in the upper surface of the $SiO_2$ film were observed while the bias voltage was changed in forming the first dielectric layer 3. FIG. 6 plots the observed result. A vertical axis of FIG. 6 represents the magnitude of the unevenness. With reference to FIG. 5, the magnitude of the unevenness implies a proportion of a difference $H_0$ between the height of the first dielectric layer above the center of the finger electrode 5a and the height of the first dielectric layer above the center of the gap between the finger electrodes, i.e., a difference in height between a concave portion and a convex portion, with respect to λ.

As seen from FIG. 6, the magnitude of the unevenness is smaller at the higher bias voltage as illustrated in FIGS. 4A to 4C. Further, as seen from the result of FIG. 6, the magnitude of the unevenness is changed along a curve of a quadratic function with respect to change of the bias voltage. In other words, as the bias voltage increases, the magnitude of the unevenness is reduced and, in addition, a change amount of the magnitude of the unevenness with respect to the change of the bias voltage is also reduced.

Accordingly, it is desirable to use a bias voltage range where not only the magnitude of the unevenness, but also a change rate of the magnitude of the unevenness can be reduced. Though depending on the material used, etc., such a bias voltage range is desirably set to a range where a processing rate is reduced by about 10% or more in comparison with that obtained at a film forming speed when the bias voltage is not applied.

However, if the bias voltage is too high, the film forming speed is reduced and a cost is increased. Accordingly, it is desirable to use a voltage range where the processing rate is not reduced to 50% or below in comparison with that obtained at the film forming speed when the bias voltage is not applied. In this preferred embodiment, as described above, after forming the first dielectric layer 3 by the bias sputtering, the upper surface of the first dielectric layer 3 is flattened by the milling, for example. A process for the flattening is not limited to the milling, and it may be carried out by suitable one of other various methods, such as dry etching, CMP, and etching-back. It should be noted that, in this preferred embodiment, the flattening process may not be carried out because the first dielectric layer 3 is formed by the bias sputtering and the unevenness in the upper surface of the first dielectric layer 3 is held small to begin with. Anyway, with the flattening process, the unevenness in the upper surface of the first dielectric layer 3 can be made smaller and a flatter surface can be obtained.

Another deposition method may be used instead of the bias sputtering. In that case, the magnitude of the unevenness is preferably held at about 5% or less by carrying out the flattening process.

In the flattening process, after forming the first dielectric layer 3, the resonant frequency and the thickness of the obtained $SiO_2$ film are measured to determine an amount of $SiO_2$ to be removed.

Figure 7:
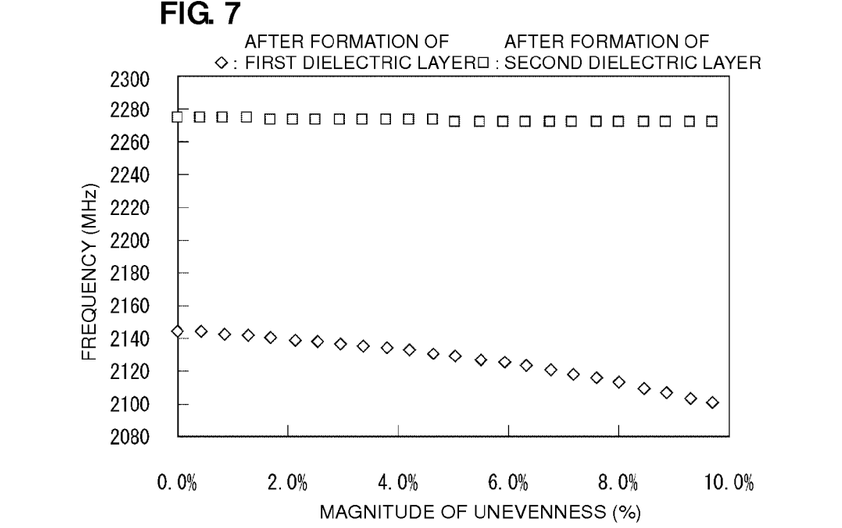
FIG. 7 is a graph plotting changes of the resonant frequency with respect to the magnitude of unevenness in the upper surface of the $SiO_2$ film after formation of the $SiO_2$ film and after formation of the SiN film.

FIG. 7 is a graph plotting the relationship between the magnitude of unevenness of the first dielectric layer 3 and the resonant frequency in each of states after the formation of the first dielectric layer 3 and after the formation of the second dielectric layer 4 in this preferred embodiment. In FIG. 7, a mark ◇ represents the resonant frequency after the formation of the first dielectric layer, and a mark □ represents the resonant frequency after the formation of the second dielectric layer 4.

As seen from FIG. 7, as the magnitude of unevenness in the upper surface of the first dielectric layer 3 increases, the resonant frequency after the formation of the first dielectric layer 3 lowers. More specifically, compared with the case where the magnitude of the unevenness is 0%, i.e., where the upper surface of the first dielectric layer 3 is flat, the resonant frequency lowers by about 10 MHz or more when the magnitude of the unevenness exceeds about 5.0%, for example. Also, as the magnitude of the unevenness gradually increases in excess of about 5.0%, the resonant frequency further lowers. When the magnitude of the unevenness is about 9.8%, the resonant frequency lowers by about 40 MHz, for example.

Moreover, while the influence of the magnitude of the unevenness after the formation of the first dielectric layer 3 is relatively large, the frequency change caused by the unevenness in the surface of the first dielectric layer 3 after the formation of the second dielectric layer 4 is relatively small. It is hence understood that the unevenness in the surface of the first dielectric layer 3 greatly affects an amount of the frequency change between before and after the formation of the second dielectric layer 4.

Figure 8:
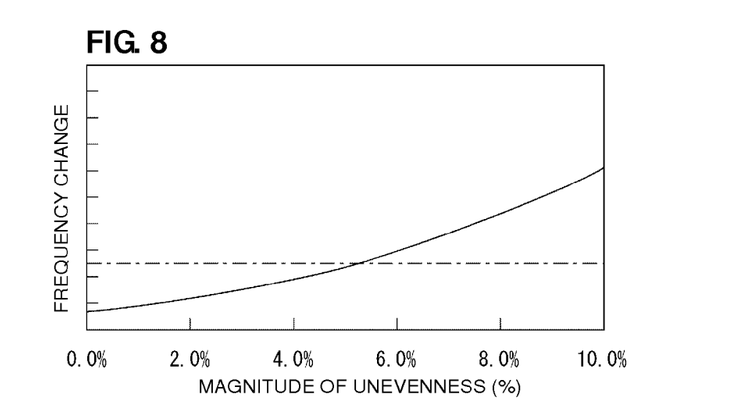
FIG. 8 is a graph plotting the relationship between the magnitude of unevenness in the upper surface of the $SiO_2$ film and a frequency change in a finally-obtained boundary acoustic wave device.

On the other hand, FIG. 8 is a graph plotting the relationship between the magnitude of the unevenness and a frequency tolerance after the formation of the second dielectric layer. Here, the term "frequency tolerance" implies the magnitude of frequency variation in the boundary acoustic wave device 1. The graph of FIG. 8 is obtained by fabricating many boundary acoustic wave devices in which the magnitude of the unevenness has various values, determining a frequency variation, i.e., a frequency tolerance, with respect to the design frequency, and plotting the determined result. As seen from FIG. 8, as the magnitude of the unevenness increases, a value of the frequency tolerance finally obtained after the formation of the second dielectric layer also increases.

At present, accuracy of about 0.5 MHz to several MHz is preferred as the frequency tolerance in bandpass filters and antenna duplexers for a band of about 0.5 GHz to about 3 GHz, which are primarily used in radio frequency bands.

In the above-described preferred embodiment, the boundary acoustic wave resonator having the wavelength of about 1.9 μm, i.e., the frequency in a band of 2 GHz, is preferably provided. In that case, as seen from FIG. 8, the magnitude of the unevenness is preferred to be about 5.0% or less in terms of ratio to the wavelength for obtaining the frequency tolerance of ±1 MHz, for example.

In various preferred embodiments of the present invention, therefore, even when the thickness of the IDT electrode is as large as about 10% or more of $\lambda$, the frequency tolerance can be made very small by setting $H_0 = H1 - H2$, which corresponds to the magnitude of the unevenness, to be about 5.0% or less of $\lambda$. When the film thickness of the IDT electrode is less than about 10% of $\lambda$, the unevenness in the surface of the first dielectric layer attributable to the formation of the IDT electrode is not so large. As described above, however, when the film thickness of the IDT electrode is 10% or more, the unevenness in the surface of the first dielectric layer tends to become relatively large. For that reason, various preferred embodiments of the present invention are particularly effective in the boundary acoustic wave device of the three-medium structure in which the film thickness of the IDT electrode is preferably set to be about 10% or more of $\lambda$ in order to reduce the resistance of the IDT electrode. It is hence to be noted that the condition of setting the film thickness of the IDT electrode to be about 10% or more does not imply a numerical restriction indicating a boundary between a range where the advantages achieved by various preferred embodiments of the present invention are obtained and a range where the advantages achieved by various preferred embodiments of the present invention are not obtained.

Thus, one of the unique advantageous features of preferred embodiments of the present invention is that, even when the film thickness of the IDT electrode is set to be about 10% or more of $\lambda$, the frequency tolerance in the three-medium structure can be remarkably reduced. Here, the point of setting the film thickness of the IDT electrode to be about 10% or more of $\lambda$ just represents a precondition for the boundary acoustic wave device to which various preferred embodiments of the present invention are applied.

As the bias voltage increases, the film forming speed is reduced as described above. In view of such a point, the manufacturing method may be modified as follows. When the first dielectric layer 3 is formed, the bias voltage is adjusted such that the magnitude of unevenness in the upper surface of the first dielectric layer 3 is about 5% or more after the formation of the first dielectric layer 3, and that no voids are formed in the $SiO_2$. Further, after forming the first dielectric layer 3, the magnitude of the unevenness is reduced to about 5% or below by the above-mentioned flattening process. In that case, the boundary acoustic wave device having a sufficiently small frequency tolerance can be provided according to preferred embodiments of the present invention without significantly reducing the film-forming speed.

While the first dielectric layer 3 is preferably formed by the bias sputtering in the above-described preferred embodiment, the first dielectric layer in the boundary acoustic wave device of the present invention may be a deposited film, which is formed by some other deposition method than the bias sputtering.

While the IDT electrode 5 and the reflectors 6 and 7 are preferably formed by the electron beam evaporation in the above-described preferred embodiment, they may be formed by some other suitable film-forming method, e.g., sputtering.

In the above-described preferred embodiment, the IDT electrode 5 is preferably formed of the multilayer metal film containing Pt and AlCu as main components. In the present invention, however, the IDT electrode may be made of other suitable metals or may be formed of a single metal film.

When the IDT electrode 5 is formed of the multilayer metal film, it is desirable that the multilayer metal film is primarily formed of a metal film made of Pt, Au, Cu, Ag, Al, W, or an alloy containing at least one of those metals as a main component. The IDT electrode 5 thus formed can improve the waveguide effect and reduce the resistance, thereby reducing the loss.

Further, instead of the Ti film, a NiCr film or the like may be used as the adhesive layer and/or the barrier layer.

While the first dielectric layer 3 is preferably made of $SiO_2$, the material of the first dielectric layer 3 is not limited to $SiO_2$. In other words, the first dielectric layer 3 may be made of one of various dielectric materials, such as silicon oxide, silicon oxynitride, aluminum oxide, aluminum nitride, and diamond-like carbon.

Also, the second dielectric layer 4 can be made of an appropriate dielectric exhibiting a higher acoustic velocity than the first dielectric layer 3. Examples of such a dielectric include silicon nitride, silicon oxynitride, aluminum oxide, aluminum nitride, and diamond-like carbon.

In addition, while the $Ta_2O_5$ film is preferably formed as the underlying film of the IDT electrode 5 in the above-described preferred embodiment, the underlying film may be not formed. Further, the underlying film may be made of, instead of $Ta_2O_5$, a material having the dielectric constant of 10 or more, such as $TiO_2$, $Nb_2O_5$, $ZrO_2$ or $HfO_2$.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a boundary acoustic wave device, the method comprising the steps of:
    forming an IDT electrode on a piezoelectric substrate;
    depositing a dielectric material on the piezoelectric substrate to cover the IDT electrode by a deposition method, thereby forming a first dielectric layer; and
    forming a second dielectric layer on the first dielectric layer; wherein
    assuming a wavelength of a boundary acoustic wave to be $\lambda$, a normalized film thickness of the IDT electrode is about 10% or more of $\lambda$, and a difference between a height of the first dielectric layer, measured from an upper surface of the piezoelectric substrate, above a center of an electrode finger of the IDT electrode and a height of the first dielectric layer, measured from the upper surface of the piezoelectric substrate, above a center of a gap between adjacent electrode fingers is about 5% or less of the wavelength $\lambda$.

2. The method of manufacturing the boundary acoustic wave device according to claim 1, wherein the deposition method is bias sputtering.

3. The method of manufacturing the boundary acoustic wave device according to claim 1, further comprising the step of flattening a surface of the first dielectric layer after forming the first dielectric layer by the deposition method.

4. The method of manufacturing the boundary acoustic wave device according to claim 1, wherein the step of flattening the upper surface of the first dielectric layer is carried out by at least one process selected from a group consisting of milling, dry etching, CMP, and etching-back of the surface of the first dielectric layer.

* * * * *